United States Patent
He et al.

(10) Patent No.: US 8,456,067 B2
(45) Date of Patent: Jun. 4, 2013

(54) PIEZOELECTRIC SENSOR AND METHOD FOR MAKING THE SAME

(75) Inventors: Xiang-Ming He, Beijing (CN); Wei-Hua Pu, Beijing (CN); Li Wang, Beijing (CN); Jian-Jun Li, Beijing (CN); Jian Gao, Beijing (CN); Jian-Guo Ren, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 204 days.

(21) Appl. No.: 12/886,751

(22) Filed: Sep. 21, 2010

(65) Prior Publication Data

US 2011/0121688 A1 May 26, 2011

(30) Foreign Application Priority Data

Nov. 24, 2009 (CN) .......................... 2009 1 0188417

(51) Int. Cl.
*H01L 41/193* (2006.01)
(52) U.S. Cl.
CPC ............. *H01L 41/193* (2013.01); *Y10S 310/80* (2013.01)
USPC .......................................... 310/358; 310/800

(58) Field of Classification Search
USPC .................................................. 310/338, 800
See application file for complete search history.

(56) References Cited

U.S. PATENT DOCUMENTS

| 2005/0211978 | A1* | 9/2005 | Bu et al. ........................... 257/40 |
| 2008/0287313 | A1* | 11/2008 | Yoshida et al. ................... 506/9 |
| 2009/0301875 | A1* | 12/2009 | Wu et al. ........................ 204/400 |

FOREIGN PATENT DOCUMENTS

| CN | 1674293 | 9/2005 |
| TW | I270982 | 1/2007 |

OTHER PUBLICATIONS

Mechanism of oxidisation of polyacrylonitrile fibres, W.Watt et al., Nature vol. 257, Sep. 18, 1975, p. 210-212.

* cited by examiner

*Primary Examiner* — Derek Rosenau
(74) *Attorney, Agent, or Firm* — Altis Law Group, Inc.

(57) ABSTRACT

The present disclosure relates to a piezoelectric sensor. The piezoelectric sensor includes a polymer layer, a first metal layer, and a second metal layer. The polymer layer includes pyrolytic polyacrylonitrile. The first metal layer is located on a surface of the polymer layer. The first metal layer includes a first work function. The second metal layer is located on another surface of the polymer layer and includes a second work function different from the first work function. The present disclosure also relates to a method for making the piezoelectric sensor.

10 Claims, 5 Drawing Sheets

PIEZOELECTRIC SENSOR AND METHOD FOR MAKING THE SAME

CROSS-REFERENCE TO RELATED APPLICATIONS

This application claims all benefits accruing under 35 U.S.C. §119 from China Patent Application No. 200910188417.4, filed on Nov. 24, 2009, in the China Intellectual Property Office, the disclosure of which is incorporated herein by reference.

BACKGROUND

1. Technical Field

The present disclosure relates to a piezoelectric sensor and a method for making the same.

2. Description of Related Art

A piezoelectric sensor can transform a pressure signal to an electrical signal. The piezoelectric sensor includes a piezoelectric material layer and two electrodes located on opposite sides of the piezoelectric material layer. By applying a pressure to the piezoelectric sensor, a corresponding electrical signal can be detected by the two electrodes. However, the material of the piezoelectric material layer which should be a material having a piezoelectric effect, is limited to piezoelectric ceramics and piezoelectric polymers. The piezoelectric ceramics can be barium titanate, lead titanate, and lead zirconium titanate (PZT). The piezoelectric polymer can be polyvinylidene fluoride (PVDF). Polyacrylonitrile (PAN) is a copolymer of acrylonitrile monomers, and can be used for making textile fibers, such as acrylic fibers and carbon fibers.

What is needed, therefore, is to provide a new piezoelectric sensor and a method for making the same.

BRIEF DESCRIPTION OF THE DRAWINGS

Many aspects of the present disclosure can be better understood with reference to the following drawings. The components in the drawings are not necessarily to scale, the emphasis instead being placed upon clearly illustrating the principles of the present embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean at least one.

Figure 1:
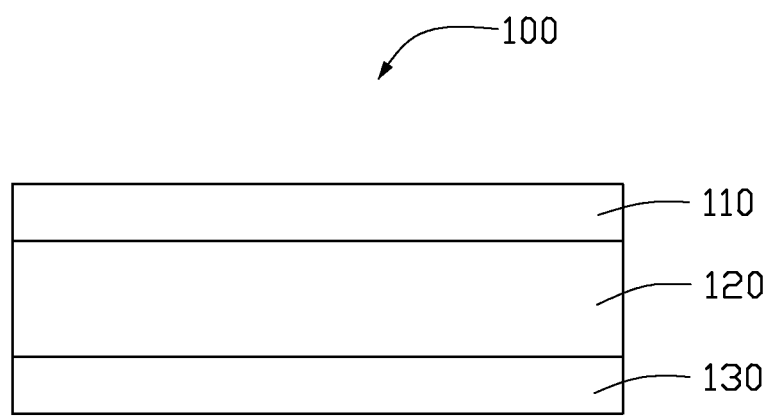
FIG. 1 is a schematic structural view of an embodiment of a piezoelectric sensor.

Referring to FIG. 1, a piezoelectric sensor 100 includes a polymer layer 120, a first metal layer 110, and a second metal layer 130. The polymer layer 120 has two opposite surfaces. The first metal layer 110 is located on one surface of the two opposite surfaces, and the second metal layer 130 is located on the other surface of the polymer layer 120, thereby forming a layered structure. The polymer layer 120 is located between the first metal layer 110 and the second metal layer 130.

The polymer layer 120 is mainly made of pyrolytic polyacrylonitrile (PPAN). The PPAN can be achieved by heating the polyacrylonitrile (PAN) at a temperature below 350° C. for a period of time. Through heating, the molecular chains of PAN undergo a cyclization action form a conjugated-chain chemical structure, which includes a condensed naphthyridine ring structure. The condensed naphthyridine ring structure can be represented by a structural formula of

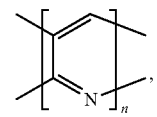

and a chemical formula of $-[C_3NH]_n-$. Further, the polymer layer 120 may also include a small amount of binder to combine the polymer layer 120 with the first and second metal layers 110 and 120. A weight percentage of the PPAN in the polymer layer 120 is above about 90%, and in one embodiment, above about 95%. In one embodiment, the polymer layer 120 includes about 97% of PPAN and about 3% of binder. A material of the binder can be PAN. A thickness of the polymer layer 120 can be in a range from about 1 micron to about 500 microns, and in one embodiment, a thickness in a range from about 100 microns to about 200 microns. In another embodiment, the thickness of the polymer layer 120 is about 150 microns.

The materials of the first metal layer 110 and the second metal layer 130 are both metals. The work functions of the first metal layer 110 and the second metal layer 130 are different. In one embodiment, the difference between the work functions of the first metal layer 110 and the second metal layer 130 is very large (e.g., above 0.5 eV). The first metal layer 110 and the second metal layer 130 with different work functions sandwich the polymer layer 120, and form Schottky contacts between the first metal layer 110 and the polymer layer 120, and between the second metal layer 130 and the polymer layer 120. By applying a pressure, the compressive strains of the polymer layer 110 cause the structural change of PPAN, inducing the charge separation in the polymer layer 110. The electrons go to the first metal layer 110 and the second metal layer 130 through the Schottky contacts, then form the current and the potential difference between the first metal layer 110 and the second metal layer 130. The larger the difference between the work functions of the first and second metal layers 110 and 130, the higher the potential difference between the first and second metal layers 110 and 130 when the same pressure is applied on the piezoelectric sensor 100.

The materials of the first metal layer 110 and the second layer 130 can be, respectively, aluminum and copper (Al and Cu), aluminum and nickel (Al and Ni), aluminum and gold (Al and Au), or zinc and gold (Zn and Au). In one embodiment, the first metal layer 110 is made of Al (work function is about 4.28 eV), and the second metal layer 130 is made of Au (work function is about 5.1 eV). The first metal layer 110 and the second metal layer 130 can be metal sheets or metal films. The metal sheets can be pressed to be combined with the polymer layer 120. The metal films can be deposited or plated on the surfaces of the polymer layer 120. The metal sheets can have a thickness of about 200 microns to about 1 millimeter.

The metal films can have a thickness of about 1 micron to about 200 microns. In one embodiment, the first and second metal layers 110, 130 are both metal sheets with a thickness of about 0.5 millimeters.

Figure 2:
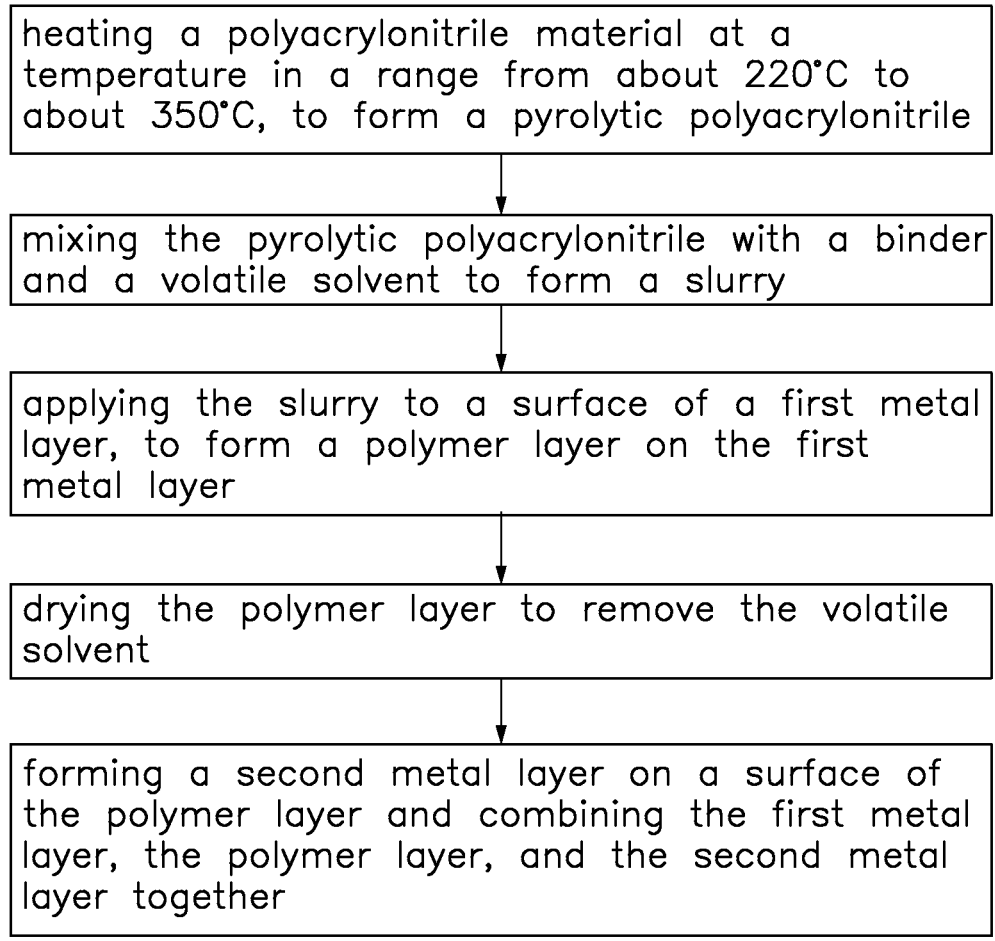
FIG. 2 is a flow chart of an embodiment of a method for making the piezoelectric sensor.

Referring to FIG. 2, an embodiment of a method for making a piezoelectric sensor 100 includes steps of:

S10, heating a PAN material at a temperature in a range from about 220° C. to about 350° C., for about 1 hour to about 10 hours, to form the PPAN;

S11, mixing the PPAN with a binder and a volatile solvent to form a slurry;

S12, applying the slurry to a surface of a first metal layer 110, to form a polymer layer 120 on the first metal layer 110;

S13, drying the polymer layer 120 to remove the volatile solvent;

S14, forming a second metal layer 130 on a surface of the polymer layer 120 and combining the first metal layer 110, the polymer layer 120, and the second metal layer 130 together.

In step S10, in one embodiment, the PAN material is heated at about 300° C., for about 5 hours. The PAN material can be PAN powder, and the resulted PPAN can also be in powder form.

In step S11, a mass ratio of the PPAN and the binder can be in a range from about 9:1 to about 99:1 (e.g., 97:3). The volatile solvent is for forming a fluid-like slurry adapted for casting a layer. The volatile solvent can be an organic solvent such as ethanol, methanol, and acetone. In one embodiment, about 9.7 g PPAN and about 0.3 g PAN used as the binder are mixed with 10 ml dimethylformide (DMF) used as the volatile solvent in a mortar.

In step S12, the slurry is cast on the first metal layer 110, such as an Al foil, with a scalpel, to form the polymer layer 120 with the thickness of about 150 microns.

In step S13, the polymer layer 120 applied on the first metal layer 110 can be arranged in an oven to dry for about 2 to about 10 hours, at a temperature of about 40° C. to about 100° C. In one embodiment, the polymer layer 120 is dried at about 60° C. for about 6 hours.

In step S14, a pair of pressing rollers, can press the sandwiched first metal layer 110, polymer layer 120, and second metal layer 130 to combine the three layers together. In one embodiment, the second metal layer 130 is an Au foil.

Figure 3:
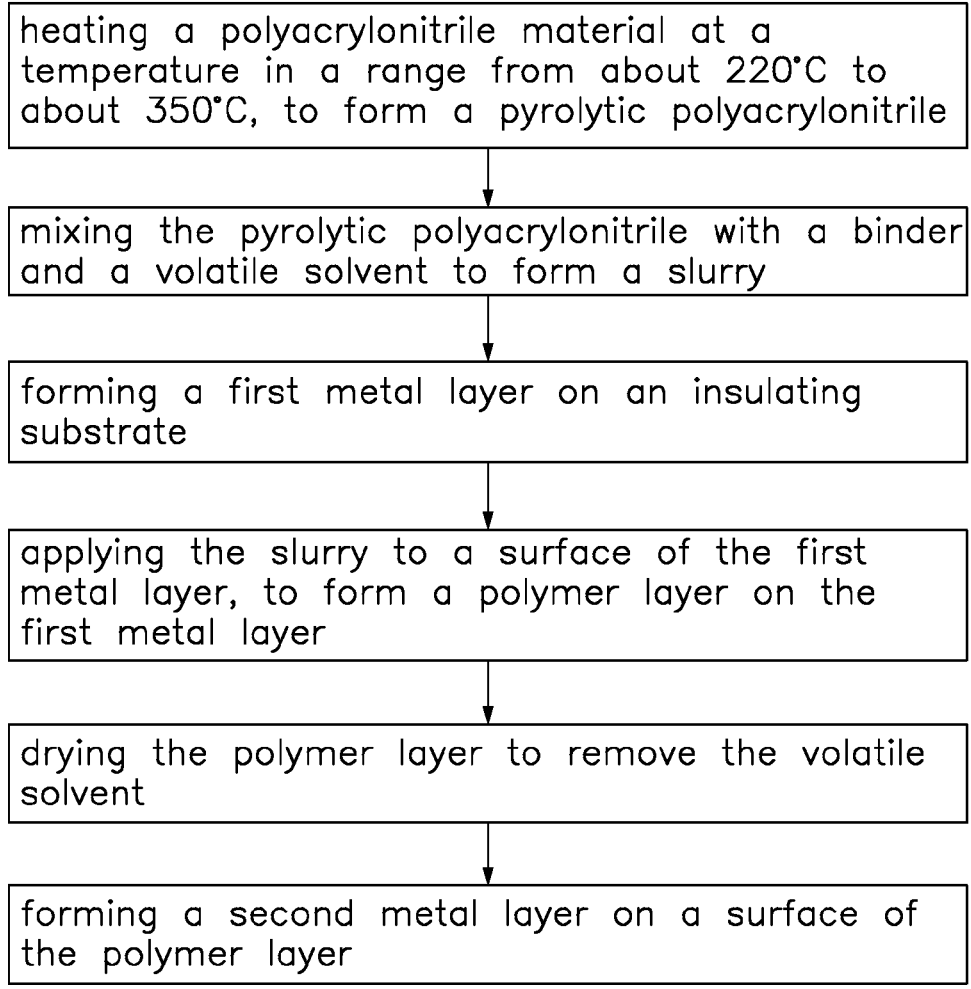
FIG. 3 is a flow chart of another embodiment of a method for making the piezoelectric sensor.

Referring to FIG. 3, another embodiment of a method for making a piezoelectric sensor 100 includes steps of:

S20, heating a PAN material at a temperature in a range from about 220° C. to about 350° C., for about 1 hour to about 10 hours, to form the PPAN;

S21, mixing the PPAN with a binder and a volatile solvent to form a slurry;

S22, forming a first metal layer 110 on an insulating substrate;

S23, applying the slurry to a surface of the first metal layer 110, to form a polymer layer 120 on the first metal layer 110;

S24, drying the polymer layer 120 to remove the volatile solvent; and

S25, forming a second metal layer 130 on a surface of the polymer layer 120.

In step S22, the first metal layer 110 can be formed on the surface of the insulating substrate by depositing, plating, sputtering, or evaporating a metal film on the insulating substrate. The metal film can have a relatively thinner thickness. In one embodiment, an Al film used as the first metal layer 110 with a thickness of about 100 microns is sputtered on a surface of a silicon substrate.

In step S25, the second metal layer 130 can be formed on the surface of the polymer layer 120 by using the same method as forming the first metal layer 110. In one embodiment, an Au film used as the second metal layer 130 with a thickness of about 100 microns is sputtered on the surface of the polymer layer 120.

Figure 4:
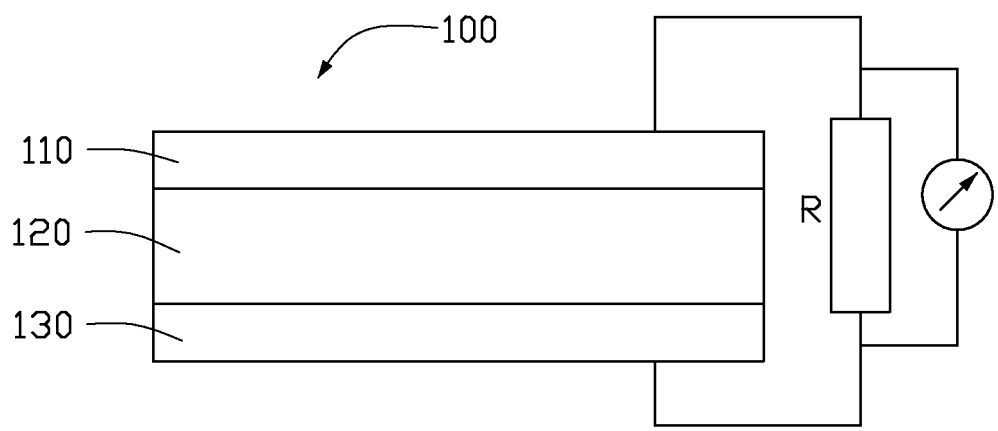
FIG. 4 is a schematic structural view of an embodiment of the piezoelectric sensor connected in a circuit during test.
Figure 5:
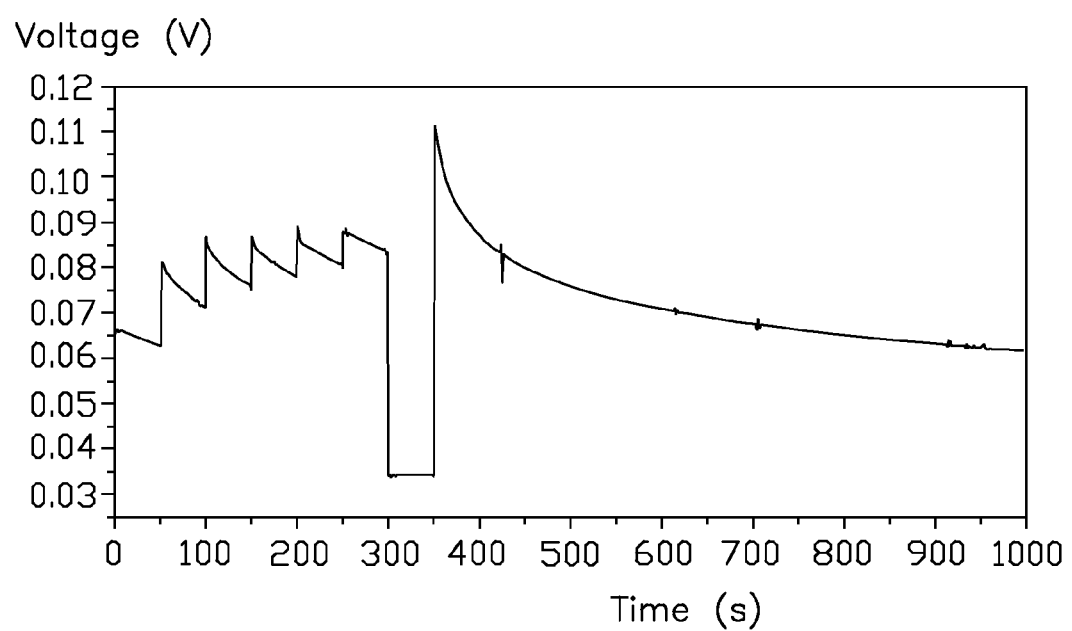
FIG. 5 is a testing diagram of the piezoelectric sensor.

When an external force presses the piezoelectric sensor 100, an open circuit voltage and a short circuit current can be detected. Referring to FIG. 4, the piezoelectric sensor 100 with a size of about 20 cm×20 cm, is connected with a loading resistance R in a testing circuit. The loading resistance R is $4.0 \times 10^6$ Ohm. Referring to FIG. 5, the voltage of the loading resistance R increases as the applied force increases with the time. The detailed testing data is listed in Table 1.

TABLE 1

|  | Time(s) | | | |
| --- | --- | --- | --- | --- |
|  | 0-50 | 50-100 | 100-150 | 150-200 |
| Force(kilo Newton) | 10 | 20 | 30 | 40 |
| Voltage(mV) | 65 | 80 | 85 | 85 |
|  | Time(s) | | | |
|  | 200-250 | 250-300 | 300-350 | 350-1000 |
| Force(kilo Newton) | 50 | 60 | 4 | 60 |
| Voltage(mV) | 88 | 88 | 35 | 110 |

The voltage on the loading resistance R changes from about 34 mV to about 110 mV as the applied force changes between about 4 kilo Newton and about 60 kilo Newton. The minimum power is about 0.3 nW (nano Watt) when the applied force is about 4 kilo Newton, and the maximum power is about 3.0 nW when the applied force jumps to about 60 kilo Newton from about 4 kilo Newton. The power gradually decreases and can last for several hours when a force is applied to the piezoelectric sensor 100. The power (voltage upon the resistance) always jumps to a higher value as a bigger force is applied upon the piezoelectric sensor 100, and then gradually decreases when the force holds steady. The piezoelectric sensor 100 has a simple structure, and can be used in the field of energy conversion.

Depending on the embodiment, certain of the steps of the embodiments of the methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

Finally, it is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

What is claimed is:

1. A piezoelectric sensor comprising:
    a polymer layer comprising pyrolytic polyacrylonitrile and a binder;
    a first metal layer located on a surface of the polymer layer, the first metal layer comprising a first work function; and a second metal layer located on another surface of the polymer layer, the second metal layer comprising a second work function different from the first work function.

2. The piezoelectric sensor of claim 1, wherein the pyrolytic polyacrylonitrile is achieved by heating a polyacrylonitrile material at a temperature in a range from about 220° C. to about 350° C., for about 1 hour to 10 hours.

3. The piezoelectric sensor of claim 1, wherein a difference between the first work function and the second work function is above 0.5 eV.

4. The piezoelectric sensor of claim 1, wherein a material of the first metal layer is aluminum, and a material of the second metal layer is gold, nickel, or copper.

5. The piezoelectric sensor of claim 1, wherein a thickness of the polymer layer is in a range from about 1 micron to 500 microns.

6. The piezoelectric sensor of claim 1, wherein a weight percentage of the pyrolytic polyacrylonitrile in the polymer layer is above 90%.

7. The piezoelectric sensor of claim 1, wherein the first metal layer and the second metal layer are metal sheets or metal films.

8. The piezoelectric sensor of claim 1, wherein the polymer layer is capable of forming a current by having a pressure applied thereto.

9. The piezoelectric sensor of claim 1, wherein a material of the first metal layer is zinc, and a material of the second metal layer is gold.

10. The piezoelectric sensor of claim 7, wherein a thickness of the metal sheets is about 200 microns to about 1 millimeter, and a thickness of the metal films is about 1 micron to about 200 microns.

* * * * *